United States Patent [19]

Wedge et al.

[11] Patent Number: 5,170,126
[45] Date of Patent: Dec. 8, 1992

[54] MICROWAVE SIX-PORT NOISE PARAMETER ANALYZER

[75] Inventors: Scott W. Wedge, Upland; David B. Rugledge, Pasadena, both of Calif.

[73] Assignee: Hughes Aircraft Company, Los Angeles, Calif.

[21] Appl. No.: 699,877

[22] Filed: May 14, 1991

[51] Int. Cl.[5] ............................................ G01R 27/04
[52] U.S. Cl. .................................. 324/613; 324/638; 324/158 T
[58] Field of Search ................... 324/613, 158 T, 638, 324/95; 364/489

[56] References Cited

U.S. PATENT DOCUMENTS

| | | | |
|---|---|---|---|
| 3,619,774 | 11/1971 | Landwehr | 324/613 |
| 3,659,198 | 4/1972 | Brown | 324/158 T |
| 3,789,301 | 1/1974 | Malaviya | 324/638 |
| 3,832,633 | 8/1974 | Bowden | 324/158 T |
| 4,034,285 | 7/1977 | Ashley et al. | 324/613 |
| 4,104,583 | 8/1978 | Engen | 324/638 |
| 4,808,912 | 2/1989 | Potter et al. | 324/638 |
| 4,891,577 | 1/1990 | Ishikawa | 324/613 |
| 4,905,308 | 2/1990 | Davidson | 324/613 |
| 5,053,714 | 10/1991 | Durand | 324/613 |

Primary Examiner—Jack B. Harvey
Assistant Examiner—Maura K. Regan
Attorney, Agent, or Firm—Wanda K. Denson-Low

[57] ABSTRACT

An apparatus and method for determining the noise parameters of a two-port electronic device under test includes a six-port passive correlation network having two input ports and four output ports. Two noise sources are used, with each noise source being connected to separate input ports of the network using microwave circulators. One noise source is injected at the input port of the device under test while the other noise source is injected to the output port of the device under test. A power meter is selectively connectable to individual output ports of the network to detect the power level at the selected output port in response to predetermined noise signals from the noise sources. In the operation of the apparatus, the noise output from one noise source is held constant while the noise output from the noise source is varied. During this variation, the power meter reads power levels at the network output ports. The procedure is then repeated with the noise output from the one noise source being varied with the other is held constant. Again the power meter takes readings and the results are compared to obtain the noise parameters.

17 Claims, 2 Drawing Sheets

MICROWAVE SIX-PORT NOISE PARAMETER ANALYZER

FIELD OF THE INVENTION

The present invention pertains generally to diagnostic equipment for testing electronic devices. More particularly, the present invention pertains to test equipment which is useful as a noise analyzer. The present invention is particularly, but not exclusively, useful for determining the noise parameters of a two-port electronic device such as a microwave transistor.

BACKGROUND OF THE INVENTION

As is well known, every electronic device generates some noise during its operation. This is unavoidable and consequently, there are many reasons why it is desirable to know the noise characteristics of such a device. The most important reason being; it is desirable to know the conditions under which noise can effectively impair the operational utility of the device. Because the environment in which the device is to operate will directly affect the noise level generated by the device, and because this environment may change dramatically during the operational life of the device, some ability to predict the noise performance of the device is desirable. Typically, this prediction is done by determining the noise parameters of the device.

With the noise parameters for a device, the matching conditions which are necessary for the lowest noise operation of that particular electronic device can be determined. This is particularly helpful in the case of transistors. Nevertheless, although microwave transistors are the electronic devices of primary interest for consideration here, the considerations to be given transistors pertain as well to any two-port electronic device. For the specific case concerning microwave transistors, however, there is added capability in that the noise parameters can also be used for transistor modeling. Further, noise parameters allow predictable and producible low-noise amplifier design.

Presently, the extraction of a transistor's noise parameters is made by making noise figure measurements while a tuner changes the reflection coefficient seen by the transistor's input. Unfortunately, the tuners used for this purpose are cumbersome mechanical devices which are complicated to use. Another problem confronted in presently used methods for determining noise parameters is that large values of the reflection coefficient ($\Gamma_s$) must be generated. The undesirable result is that this can lead to instability of the electronic device under test. Such instability not only complicates the design of the measurement system, it can lead to the generation of meaningless data. Additionally, the tuners used in these testing procedures are generally very expensive. Comparable electronic tuners have a limited tuning range, require frequent calibration with a microwave network analyzer, contribute their own electronic noise, and have a limit to how high in frequency they can perform.

As is recognized by those skilled in the pertinent art, the basic purpose of any noise parameter representation is to describe the variation in noise figure (F) as a function of a reflection coefficient ($\Gamma_s$) presented to the input of the device under test (DUT). The standard formula used in industry is:

$$F = F_{min} + 4 \frac{R_n}{Z_0} \frac{|\Gamma_s - \Gamma_{opt}|^2}{|1 + \Gamma_{opt}|^2 (1 - |\Gamma_s|^2)}$$

in which:
$F_{min}$ = minimum noise figure;
$\Gamma_s$ = source reflection coefficient;
$\Gamma_{opt}$ = optimum source reflection coefficient;
$R_n$ = noise resistance; and
$Z_0$ = characteristic (or normalizing) impedance.

Since $Z_0$ is constant, and since the object has been to obtain F as a function of $\Gamma_s$, the noise parameters $F_{min}$, $\Gamma_{opt}$, and $R_n$ are of primary importance.

It happens that with $\Gamma_s = 0$, the electronic device under test will remain stable. Importantly, as recognized by the present invention, the equivalent noise parameter information may be extracted from the DUT by making a series of noise power measurements under the reflection-less condition wherein $\Gamma_s = 0$ can be accomplished while making noise power measurements of the device under test. Further, it is known that under this condition i.e. $\Gamma_s = 0$, the noise parameters $F_{min}$, $\Gamma_{opt}$, and $R_n$ can be written in terms of an alternate set of noise parameters, namely: 1) the noise power deliverable to the input termination of the device $$\overline{|c_1|^2} \; ;$$

2) the noise power deliverable to the output termination of the device $$\overline{|c_2|^2} \; ;$$

and 3) the noise power correlation between the noise levels at the input termination and the output termination $$\overline{c_1 c_2^*} \; .$$

These alternative noise parameters (referred to as "noise-wave" parameters) are related to the self- and cross-spectral densities of the random noise sources within the DUT. Specifically, as indicated above, conversion between these two parameter sets is possible, and formulas to do so have been given by J. A. Dobrowolski. See J. A. Dobrowolski, "A CAD-oriented method for noise figure computation of two-ports with any internal topology," IEEE Trans. Microwave Theory Tech., vol. MTT-37, pp. 15–20, Jan. 1989.

For the purposes of the present invention, it has been recognized that a combination of noise power level measurements can be used to determine the alternative noise-wave parameters. These noise power level measurements are made with appropriate input signals applied to directional couplers of a six-port passive correlation network.

In light of the above, it is an object of the present invention to provide a noise parameter analyzer which measures the correlation between noise at the input and noise at the output of the device under test with reflection-less loading and which is, therefore, very stable in its operation. Another object of the present invention it to provide a noise parameter analyzer which is capable of high frequency operation. Still another object of the present invention is to provide a noise parameter analyzer which is capable of simultaneously measuring both noise parameters and scattering parameter information. Yet another object of the present invention is to provide a noise analyzer which is robust, easy to use, relatively simple to manufacture, and comparatively cost effective.

SUMMARY OF THE INVENTION

An apparatus for determining and analyzing the noise parameters of a two-port electronic device, such as a microwave transistor, includes a six-port passive correlation network and a pair of noise sources. Of the six ports for the network, two are input terminals and the other four are output terminals. One of the noise sources is connected between one input of the network and the input terminal of the device under test, and the other noise source is connected between the other input of the network and the output terminal of the device. A noise power spectral density meter (hereinafter "power meter") is selectively connectable to each of the four output terminals of the network to detect a power level signal at each selected output.

For the present invention, it is possible to use any type of noise source. An example being the type 346 manufactured by Hewlett-Packard. Importantly, each noise source must be capable of generating two noise signal levels that are the equivalent of a "hot" and "cold" temperature of a resistor of value $Z_0$. The power meter is preferably of the type 8970 manufactured by Hewlett-Packard used in the noise power spectral density mode.

The six-port passive correlation network of the present invention includes a hybrid directional coupler, i.e. a single 180° 3-dB coupler, which is connected to receive input from the output of the device under test. The network also includes a first quadrature hybrid directional coupler, i.e. a 90° 3-dB coupler, which is connected to receive input from both the input terminal of the device and the hybrid coupler to generate a power level output signal at the first output port of the network. Further, the network includes a second quadrature hybrid directional coupler which is connected to receive input from the hybrid coupler to generate a power level output at the fourth output port of the network. Finally, the network includes a third quadrature hybrid directional coupler which is connected to receive input from both the first quadrature coupler and the second quadrature coupler to generate power level outputs for the second output port and the third output port of the network.

In the operation of the present invention, one of the noise sources (the first noise source) is initially maintained to generate a steady predetermined temperature noise output. Preferably, this is a relatively low temperature noise signal. While the first noise source generates a steady output, the temperature noise signal of the other noise source (the second noise source) is varied between a low temperature noise signal and a high temperature noise signal. Power level measurements are made at each of the four network output terminals by the power meter as the second noise source generates the low temperature noise signal and, again, as it generates the high temperature noise signal. The procedure is then reversed with the second noise source being maintained to generate a steady predetermined temperature noise while the first noise source is varied to generate a low temperature noise signal and a high temperature noise signal. Again, the power meter is used to make appropriate power level measurements at each of the four network output terminals.

In an alternate embodiment of the present invention microwave mixers can be connected between each noise source and its respective input terminal of the network. With these microwave mixers, the network can be effectively converted to a single intermediate frequency six-port network which is operable at much lower frequencies. Further, preamplifiers can be connected between each noise and its respective input terminal to boost the level of the noise signals being analyzed through the network.

The novel features of this invention, as well as the invention itself, both as to its structure and its operation will be best understood from the accompanying drawings, taken in conjunction with the accompanying description, in which similar reference characters refer to similar parts, and in which:

DESCRIPTION OF THE PREFERRED EMBODIMENTS

Figure 1:
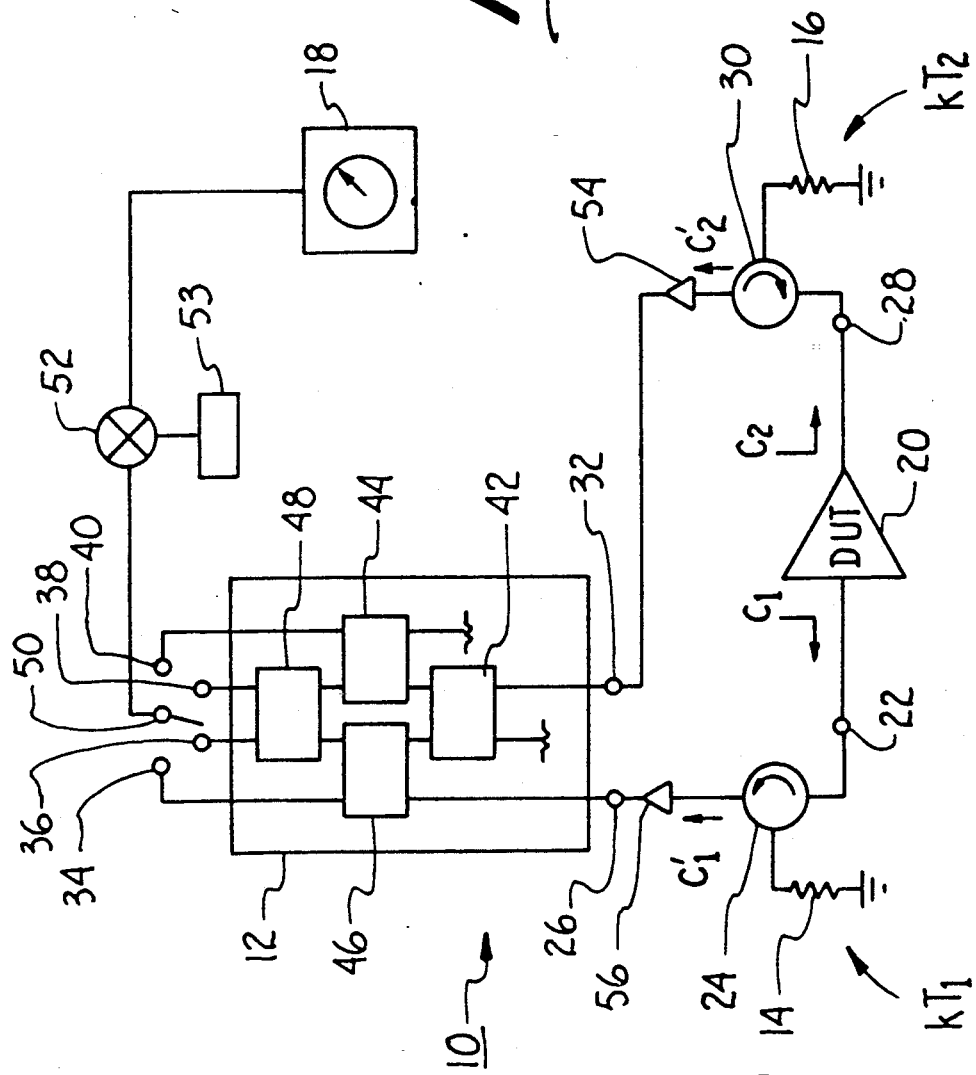
FIG. 1 is an operational schematic diagram of the novel apparatus for analyzing the noise parameters of an electronic device.
Figure 2:
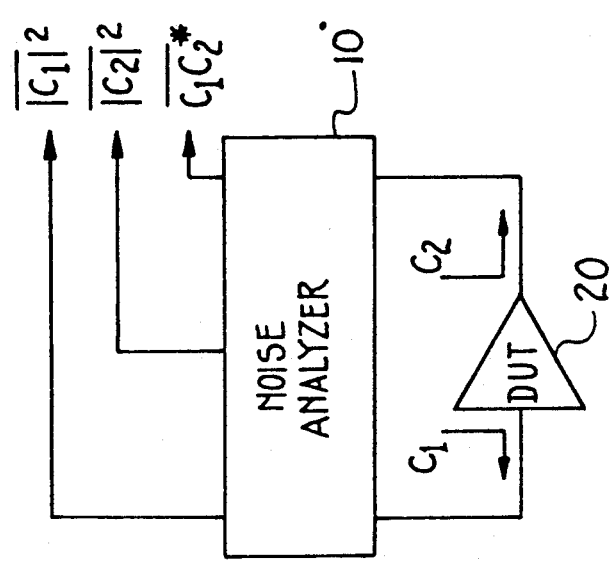
FIG. 2 is a functional block diagram of the noise signals generated in the operation of the apparatus of the present invention.

Referring initially to FIG. 1 the apparatus for analyzing and determining the noise parameters of an electronic device is shown in schematic and generally designated 10. As shown, the apparatus 10 of the present invention includes a six-port passive correlation network 12 which is operatively connected to a noise source 14, a noise source 16 and a power meter 18. A device under test (DUT) 20 is electronically connected between the noise sources 14 and 16, so that noise waves from the DUT 20 will pass through the network 12 to generate power level signals which are readable by the power meter 18. This functional relationship is, perhaps, best appreciated with reference to FIG. 2 where it can be seen that a noise wave $C_1$ and a noise wave $C_2$ propagate respectively from the input terminal and the output terminal of the DUT 20. For the purposes of the present invention, these noise waves $C_1$ and $C_2$ are directed through the apparatus 10 in a manner which generates the power level signals as indicated. Specifically, apparatus 10 generates signals with which the noise power, levels at the input and output of the DUT 20

$$\overline{|C_1|^2}, \overline{|C_2|^2},$$

and a correlation of these noise power levels $$\overline{C_1 C_2^*},$$

can be determined.

Returning to Figure it will be seen that the input terminal 22 of DUT 20 is connected to a microwave circulator 24 of a type well known in the pertinent art. Further, noise source 14 is also connected to the microwave circulator 24, and the circulator 24 is in turn connected directly into the input port 26 of network 12. Similarly, the output terminal 28 of DUT 20 is connected to a microwave circulator 30 which is connected to the noise source 16 and, also, to the input port 32 of network 12. Preferably, both noise source 14 and noise source 16 are of a type well known in the pertinent art which is capable of generating noise signals equivalent to an extended temperature range. For example, the present invention contemplates such a temperature range as being from approximately two hundred ninety degrees Kelvin (290° K.) to a temperature around ninety six hundred degrees Kelvin (9,600° K.).

As shown in FIG. 1, in addition to the input ports 26 and 32, the network 12 also includes output ports 34, 36, 38 and 40. Also, between the input ports 26, 32 and the output ports 34, 36, 38 and 40, the network 12 includes a plurality of cascaded directional couplers of types well known in the pertinent art. Specifically, the directional coupler 42 is a single 180° 3-dB coupler (denoted by an "H") and the directional couplers 44, 46 and 48 are each 90° 3-dB quadrature hybrids (each denoted by a "Q"). Example directional couplers are the type 4020180 and 1830 which are commercially available and marketed by Krytar.

The interconnection of the cascaded directional couplers 42, 44, 46 and 48, and the connection of these couplers to their inputs is important for the operation of apparatus 10. As shown in FIG. 1, it is intended that input port 26 of network 12 be connected directly into directional coupler 46. Thus, the conglomerate noise wave $C_1'$ which includes noise wave $C_1$ from DUT 20, as well as transferred noise from noise source 16 and reflected noise from noise source 14, is directed through input port 26 into the directional coupler 46. Similarly, the input port 32 of network 12 is connected directly into directional coupler 42. Thus, the conglomerate noise wave $C_2$ which includes noise wave $C_2$ from DUT 20, as well as transferred noise from noise source 14 and reflected noise from noise source 16, is directed through input port 32 into the directional coupler 42.

Within the network 12, the outputs from directional coupler 42 are directed respectively to the directional couplers 44 and 46. Consequently, the directional coupler 46 receives an input from the input terminal 22 of DUT 20 and an input from the directional coupler 42. With these inputs, the directional coupler 46 generates two outputs, one of which is connected directly to the output port 34 of network 12 while the other is passed to directional coupler 48. As shown, the directional coupler 44 receives its input from directional coupler 42 and uses this input to generate two outputs. One output from directional coupler 44 is connected directly to output port 40 of network 12 while the other output from directional coupler 44 is passed to directional coupler 48. With the inputs from directional couplers 44 and 46, directional coupler 48 generates two outputs which are separately connected to the output ports 36 and 38 of network 12. Thus, with the connections to the input ports 26, 32, as shown, network 12 generates four separate outputs which are each characteristic of a power reading. Component 50 is a non-reflective SP4T switch used to selectively connect power meter 18 with the individual output ports 34, 36, 38 and 40 of network 12 to make these separate readings. For the embodiment of the apparatus 10 shown in FIG. 1, a microwave mixer 52 and an associated local oscillator 53 are connected to the component 50 to convert the noise power from the various network output ports 34-40 down to intermediate frequencies which can be detected by the power meter 18.

For discussion here, the outputs from network 12 at output ports 34, 36, 38 and 40 are respectively denoted $P_1$, $P_2$, $P_3$ and $P_4$. With these designations, and based on the connections disclosed above for the directional couplers 42, 44, 46 and 48, it can be shown that the relationship between the power readings $P_1$, $P_2$, $P_3$, and $P_4$, and the desired power signals $$\overline{|C_1'|^2}, \overline{|C_2'|^2}, \text{ and } \overline{C_1'C_2'^*}$$

are as follows:

$$\overline{|C_1'|^2} = P_1 + P_2 + P_3 - 3P_4$$

$$\overline{|C_2'|^2} = 4P_4$$

$$Re \overline{(C_1'C_2'^*)} = \sqrt{2} (P_2 - P_3)$$

$$Im \overline{(C_1'C_2'^*)} = \frac{1}{\sqrt{2}} (P_2 - P_1 + P_3 - P_4)$$

where:

$$\overline{|c_1'|^2} = \overline{|c_1|^2} + kT_1|s_{11}|^2 + kT_2|s_{12}|^2$$

$$\overline{|c_2'|^2} = \overline{|c_2|^2} + kT_1|s_{21}|^2 + kT_2|s_{22}|^2$$

$$\overline{c_1'c_2'^*} = \overline{c_1c_2^*} + kT_1 s_{11} s_{21}^* + kT_2 s_{12} s_{22}^*$$

In the above equations, k is Boltzmann's constant, the * indicates a complex conjugate, and $T_1$ and $T_2$ are the equivalent temperatures of the two noise sources 14 and 16. By making power measurements at different values of $T_1$ and $T_2$ (the temperatures of noise sources 14 and 16) and solving the above equations simultaneously, the individual power level readings at the output ports 34, 36, 38 and 40 can be used to determine the noise parameters for DUT 20. Specifically, the values obtained from the above equations can be used in the conversion equations of Dobrowolski to compute the standard noise parameters $F_{min}$, $\sigma_{opt}$ and $R_n$ which can then be used to obtain the noise figure, F, for the DUT 20, using the equation given above which uses these variables. Solution of the above simultaneous equations requires measurements to be made at various values of T1 and T2; the equivalent temperatures of noise sources 14 and 16.

It will be appreciated that preamplifiers 54 and 56 can be added to the apparatus 10, substantially as shown in FIG. 1, for the purpose of boosting the level of noise signals which pass through the network 12 and increasing the sensitivity of the apparatus 10. As shown, the pre-amplifier 54 is connected between microwave circulator 30 and network input port 32 and the pre-amplifier 56 is connected between microwave circulator 24 and network input port 26.

Figure 3:
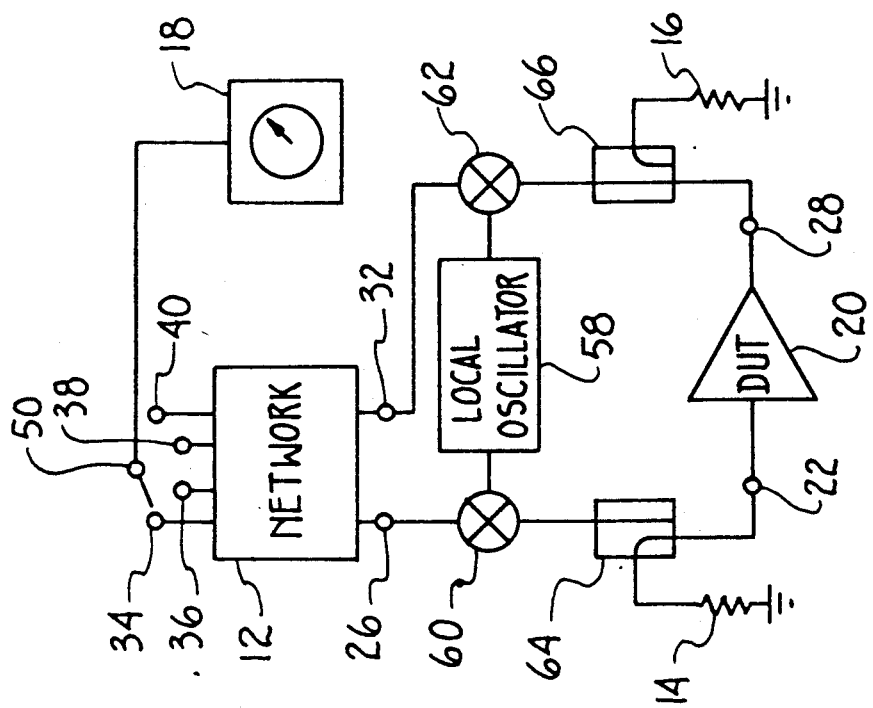
FIG. 3 is an operational schematic diagram of an alternate embodiment of the novel apparatus for analyzing the noise parameter of an electronic device.

In an alternate embodiment for the apparatus 10, a single intermediate frequency network 12 may be used. In this case, a local oscillator 58 is connected to coherent microwave mixers 60 and 62 substantially as shown in FIG. 3. With these connections, the mixers 60 and 62 effectively convert the noise-power from noise sources 14 and 16, and from DUT 20, in a manner well known in the pertinent art, down to an intermediate frequency. For example, with a single intermediate frequency network 12, operation of the apparatus 10 can be performed at a frequency around 200 MHz. For this alternate embodiment, the mixer 52 and oscillator 53 for the embodiment shown in FIG. 1, can be eliminated.

As an additional observation, it will be noted and appreciated by the skilled artisan that the microwave circulators 24, 30 shown in FIG. 1 are interchangeable with the respective directional couplers 64, 66 shown in FIG. 3. In either case, the circulators 24, 30 (FIG. 1) or the directional couplers 64, 66 (FIG. 3) inject the noise into the network 12.

OPERATION

In the operation of the apparatus 10, the input terminal 22 of DUT 20 is connected through the microwave circulator 24 to input port 26 of network 12. The output terminal 28 of DUT 20 is similarly connected through the microwave circulator 30 to input port 32 of network 12. Noise source 16 is then maintained to generate a steady noise signal ($T_2$) under approximately ambient conditions, e.g. two hundred ninety degrees Kelvin (290° k.). While noise source 16 maintains this steady signal, noise source 14 is varied to generate noise signals ($T_1$) at a relatively low temperature ($T_c$), e.g. an ambient temperature of approximately two hundred ninety degrees Kelvin, and subsequently, at a relatively high temperature ($T_h$), e.g. ninety six hundred degrees Kelvin. For each noise level established by noise source 14, the connector component 50 is selectively connected to the output ports 34, 36, 38 and 40 of network 12 to obtain respective power readings $P_1$, $P_2$, $P_3$ and $P_4$. These readings for noise source 14 ($T_1$) at $T_c$ and $T_h$ are known to have a generally linear relationship to the power and, therefore, they can be used to predict the power measurement for $T_1 32\ 0$. As will be appreciated by the skilled artisan, the predicted value at $T_1=0$ corresponds to noise power generated by only DUT 20 and the other noise source. This same procedure is then followed maintaining noise source 14 ($T_1$) at a constant temperature, while the output noise signal from noise source 16 ($T_2$) is varied between a relatively low temperature ($T_c$) and a relatively high temperature ($T_h$). In this manner, a predicted power measurement for $T_2=0$ is obtained. Combining this prediction with the $T_1=0$ prediction allows a solution of the four noise-wave parameters of DUT 20. As indicated above, these signals can then be used in determining the noise figure for DUT 20.

While the particular apparatus and method for determining the noise parameters of an electronic device as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims. In addition, the apparatus described here may be calibrated in a manner similar to that done for noise figure meters to remove system noise from the measurement. This procedure has been omitted for the sake of brevity, but it is easily seen that this procedure could account for error terms present in the expressions for $\overline{|c_1'|^2}$, $\overline{|c_2'|^2}$ and $\overline{c_1'c_2'^*}$ due to system noise.

We claim:

1. An apparatus for analyzing the noise parameters of an electronic device having an input and an output which comprises:

and having first, second, third and fourth output ports;

a first noise source for generating a noise signal, said first noise source being connected between said device input and said first input port of said network;

a second noise source for generating a noise signal, said second noise source being connected between said device output and said second input port of said network; and a power meter selectively connectable to said first, second, third or fourth output ports of said network to detect a power level at said selected output port in response to a predetermined noise signal from said first and second noise sources for determining said noise parameters.

2. An apparatus as recited in claim 1 wherein said network comprises a plurality of directional couplers.

3. An apparatus as recited in claim 1 wherein said network comprises:

a hybrid directional coupler connected for input from said device output;

a first quadrature hybrid directional coupler connected for input from said device input and said hybrid coupler to generate an output for said first output port of said network;

a second quadrature hybrid directional coupler IO connected for input from said hybrid coupler to generate an output for said fourth output port of said network; and a third quadrature hybrid directional coupler connected for input from said first quadrature coupler and said second quadrature coupler to generate an output for said second output port and said third output port of said network.

4. An apparatus as recited in claim 1 wherein said first noise source and said second noise source are operable to generate a first temperature noise and a second temperature noise.

5. An apparatus as recited in claim 4 wherein said first temperature noise is generated at an ambient temperature of approximately two hundred and ninety degrees Kelvin (290° K.) and said second temperature noise is selectively generated at a temperature of approximately ninety six hundred degrees Kelvin (9,600° K.), at a temperature of approximately seventy seven degrees Kelvin (77° K.) or at a temperature of approximately two hundred and ninety degrees Kelvin (290° K.).

6. An apparatus as recited in claim 1 wherein said electronic device being tested by said apparatus is a transistor.

7. An apparatus as recited in claim 3 further comprising a plurality of microwave circulators for injecting said noise signals into said network.

8. An apparatus as recited in claim 3 further comprising a plurality of directional couplers for injecting said noise signals into said network.

9. An apparatus for determining the noise parameters of an electronic device having an input and an output which comprises:
- a first noise source for sending a first temperature noise signal or a second temperature noise signal to said device input;
- a second noise source for sending a first temperature noise signal or a second temperature noise signal to said device output; and
- directing means connected to said device input and to said device output, said directing means having a plurality of interconnected directional couplers for receiving a noise signal from said device input and a noise signal from said device output to generate a plurality of power level outputs which are characteristic of said noise parameters.

10. An apparatus as recited in claim 9 wherein said directing means has first, second, third, and fourth output ports and said apparatus further comprises a power meter selectively connectable to said first, second, third or fourth output ports of said directing means to detect a said power level output at said selected output port in response to said noise signals from said device input and said device output for determining said noise parameters.

11. An apparatus as recited in claim 10 wherein said plurality of directional couplers for said directing means comprise:
- a hybrid directional coupler connected for input from said device output;
- a first quadrature hybrid directional coupler connected for input from said device input and said hybrid coupler to generate an output for said first output port of said directing means;
- a second quadrature hybrid directional coupler connected for input from said hybrid coupler to generate an output for said fourth output port of said directing means; and
- a third quadrature hybrid directional coupler connected for input from said first quadrature coupler and said second quadrature coupler to generate an output for said second output port and said third output port of said directing means.

12. An apparatus as recited in claim 9 wherein said first noise source and said second noise source are operable to generate a first temperature noise and a second temperature noise; and wherein said first temperature noise is generated at an ambient temperature of approximately two hundred and ninety degrees Kelvin (290° K.) and said second temperature noise is generated at a temperature of approximately ninety six hundred degrees Kelvin (9,600° K.).

13. A method for determining the noise parameters of an electronic device having an input and an output which comprises the steps of:
- providing an apparatus including a network having first and second input ports and having first, second, third and fourth output ports; a first noise source connected to said first input port of said network; and a second noise source connected to said second input port of said network;
- connecting said first noise source to said device input and said second noise source to said device output;
- generating noise with said first or said second noise source; and
- selectively connecting a power meter to said first, second, third or fourth output ports of said network to detect a power level at said selected output port in response to a predetermined noise signal from said first and second noise sources for determining said noise parameters.

14. A method as recited in claim 13 wherein said first noise source and said second noise source are operable to generate a first temperature noise and a second temperature noise; and wherein said first temperature noise is generated at an ambient temperature of approximately two hundred and ninety degrees Kelvin (290° K.) and said second temperature noise is generated at a temperature of approximately nine thousand six hundred degrees Kelvin (9,600° K.).

15. A method as recited in claim 13 further comprising the steps of:
- maintaining said second noise source at said ambient temperature while generating said first temperature noise and said second temperature noise with said first noise source; and
- alternately maintaining said first noise source at said ambient temperature while generating said first temperature noise and said second temperature noise with said second noise source.

16. A method as recited in claim 15 further comprising the steps of:
- sequentially connecting said power meter to said first, second, third or fourth output ports of said network to detect a power level at said selected output port while said second noise source is maintained at said ambient temperature; and
- sequentially connecting said power meter to said first, second, third or fourth output ports of said network to detect a power level at said selected output port while said first noise source is maintained at said ambient temperature.

17. A method as recited in claim 13 wherein said network comprises:
- a hybrid directional coupler connected for input from said device output;
- a first quadrature hybrid directional coupler connected for input from said device input and said hybrid coupler to generate an output for said first output port of said network;
- a second quadrature hybrid directional coupler connected for input from said hybrid coupler to generate an output for said fourth output port of said network; and
- a third quadrature hybrid directional coupler connected for input from said first quadrature coupler and said second quadrature coupler to generate an output for said second output port and said third output port of said network.

* * * * *